(12) United States Patent
Mannuccini et al.

(10) Patent No.: US 10,284,008 B2
(45) Date of Patent: May 7, 2019

(54) ISOLATED PARALLEL UPS SYSTEM WITH FAULT LOCATION DETECTION

(71) Applicant: ABB Schweiz AG, Baden (CH)

(72) Inventors: Andrea Mannuccini, Locarno (CH); Lorenzo Giuntini, Locarno (CH)

(73) Assignee: ABB Schweiz AG, Baden (CH)

( * ) Notice: Subject to any disclaimer, the term of this patent is extended or adjusted under 35 U.S.C. 154(b) by 410 days.

(21) Appl. No.: 15/263,821

(22) Filed: Sep. 13, 2016

(65) Prior Publication Data

US 2018/0076658 A1 Mar. 15, 2018

(51) Int. Cl.
| | | |
|---|---|---|
| *H02J 3/38* | (2006.01) | |
| *H02J 9/00* | (2006.01) | |
| *H02J 9/06* | (2006.01) | |
| *H02M 7/44* | (2006.01) | |
| *G01R 31/40* | (2014.01) | |
| *G01R 31/02* | (2006.01) | |
| *G01R 31/08* | (2006.01) | |

(52) U.S. Cl.
CPC ............ *H02J 9/061* (2013.01); *G01R 31/028* (2013.01); *G01R 31/086* (2013.01); *G01R 31/40* (2013.01); *H02J 9/062* (2013.01); *H02M 7/44* (2013.01)

(58) Field of Classification Search
USPC .......................................................... 307/23
See application file for complete search history.

(56) References Cited

U.S. PATENT DOCUMENTS

| | | |
|---|---|---|
| 5,153,802 A | 10/1992 | Mertz et al. |
| 5,315,533 A | 5/1994 | Stich et al. |
| 5,745,355 A | 4/1998 | Tracy et al. |

(Continued)

FOREIGN PATENT DOCUMENTS

| | | |
|---|---|---|
| CN | 102801196 B | 11/2012 |
| CN | 204258411 U | 4/2015 |

(Continued)

OTHER PUBLICATIONS

Heising et al., "Reliability Considerations in Systems Applications of Uninterruptible Power Supplies", IEEE Transactions on Industry Applications, vol. IA-8, issue 2, pp. 104-107, Mar. 1972.

(Continued)

*Primary Examiner* — Rexford Barnie
*Assistant Examiner* — Dru Parries
(74) *Attorney, Agent, or Firm* — Barnes & Thornburg LLP

(57) ABSTRACT

An uninterruptible power supply (UPS) system is provided. The UPS system includes a plurality of UPSs, a ring bus that electrically couples the UPSs together, a static switch coupled between an associated UPS of the UPSs and the ring bus, and a controller. The controller receives current data representative of an inverter current and a load current associated with the associated UPS. An output capacitor of the associated UPS is coupled to a node that conducts the inverter current and the load current. The controller further calculates a measured current based on the received current data, determines a voltage of said output capacitor, generates a derived current based on the determined voltage and a predetermined capacitance of said output capacitor, compares the measured current and the derived current to identify a fault location, and controls said static switch based on the identified fault location.

17 Claims, 8 Drawing Sheets

(56) References Cited

U.S. PATENT DOCUMENTS

| | | |
|---|---|---|
| 6,275,958 B1 | 8/2001 | Carpenter et al. |
| 6,407,899 B1 | 6/2002 | Carpenter |
| 6,768,223 B2 | 7/2004 | Powell et al. |
| 7,403,364 B2 | 7/2008 | Anderson et al. |
| 7,459,803 B2 | 12/2008 | Mosman |
| 7,613,974 B2 | 11/2009 | Meagher |
| 8,060,321 B2 | 11/2011 | Heber et al. |
| 8,513,951 B2 | 8/2013 | Wunderlich et al. |
| 8,581,723 B2 | 11/2013 | Schweitzer, III et al. |
| 9,093,860 B2 | 7/2015 | Beg |
| 9,160,202 B2 | 10/2015 | Colombi et al. |
| 9,170,568 B1 | 10/2015 | Proca et al. |
| 9,236,768 B2 | 1/2016 | Giuntini et al. |
| 2013/0321967 A1 | 12/2013 | Muneyasu et al. |
| 2014/0012522 A1 | 1/2014 | Colombi et al. |
| 2014/0139022 A1 | 5/2014 | Bush et al. |
| 2015/0244210 A1 | 8/2015 | Kolhatkar et al. |
| 2015/0263566 A1 | 9/2015 | Kolhatkar et al. |
| 2015/0263567 A1 | 9/2015 | Kolhatkar et al. |
| 2015/0263568 A1 | 9/2015 | Colombi et al. |
| 2016/0103190 A1 | 4/2016 | Sebald et al. |
| 2016/0118847 A1 | 4/2016 | Colombi et al. |
| 2018/0076659 A1 | 3/2018 | Giuntini et al. |

FOREIGN PATENT DOCUMENTS

| | | |
|---|---|---|
| EP | 1 710 890 A2 | 10/2006 |
| KR | 101037713 B1 | 5/2011 |
| WO | 2014/098800 A1 | 6/2014 |

OTHER PUBLICATIONS

Anisha et al., "Multi agent based distribution system restoration with distributed generation", Emerging Trends in New & Renewable Energy Sources and Energy Management (NCET NRES EM), 2014 IEEE National Conference on, pp. 209-213, Dec. 2014.

Extended European Search Report and Opinion issued in connection with corresponding EP Application No. 17188222.8 dated Jan. 15, 2018.

ISOLATED PARALLEL UPS SYSTEM WITH FAULT LOCATION DETECTION

BACKGROUND OF THE INVENTION

The field of the invention relates generally to uninterrupted power supplies (UPS), and more specifically, isolated parallel ring buses for interconnected UPS systems including choke bypass switches.

Robust power systems enable supplying power to one or more loads. Such power systems may include combinations of generation, transport, rectification, inversion and conversion of power to supply energy for electronic, optical, mechanical, and/or nuclear applications and loads. When implementing power systems and architectures, practical considerations include cost, size, reliability, and ease of implementation.

In at least some known power systems, one or more uninterruptible power supplies (UPSs) facilitate supplying power to a load. UPSs facilitate ensuring that power is continuously supplied to one or more critical loads, even when one or more components of a power system fail. Accordingly, UPSs provide a redundant power source. UPSs may be utilized in a number of applications (e.g., utility substations, industrial plants, marine systems, high security systems, hospitals, datacomm and telecomm centers, semiconductor manufacturing sites, nuclear power plants, etc.). Further, UPSs may be utilized in high, medium, or low power applications. For example, UPSs may be used in relatively small power systems (e.g., entertainment or consumer systems) or microsystems (e.g., a chip-based system).

However, if a UPS fails or is malfunctioning, the load may not receive sufficient quality power to operate. In at least some known systems, multiple UPSs are coupled to a load to provide additional power redundancy. If one UPS fails, the other UPSs provide power to the load. In these known systems, the transient caused by a UPS failure can reduce the power quality of the power supplied to the load. For example, in systems with a power distribution unit (PDU) isolation transformer coupled between the UPSs and the load, isolating a fault from a failed UPS may saturate the PDU isolation transformer, which affects the power quality of the power supplied to the load.

BRIEF DESCRIPTION

In one aspect, an uninterruptible power supply (UPS) system is provided. The UPS system includes a plurality of UPSs, a ring bus that electrically couples the UPSs together, a static switch coupled between an associated UPS of the UPSs and the ring bus, and a controller. The controller receives current data representative of an inverter current and a load current associated with the associated UPS. An output capacitor of the associated UPS is coupled to a node that conducts the inverter current and the load current. The controller further calculates a measured current based on the received current data, determines a voltage of said output capacitor, generates a derived current based on the determined voltage and a predetermined capacitance of said output capacitor, compares the measured current and the derived current to identify a fault location, and controls said static switch based on the identified fault location.

In another aspect, a controller for identifying a fault location in a UPS system including a plurality of UPSs and a ring bus that electrically couples the plurality of UPSs together is provide. The controller is communicatively coupled to a static switch coupled between an associated UPS of the UPSs and the ring bus. The controller receives current data representative of an inverter current and a load current associated with the associated UPS. An output capacitor of the associated UPS is coupled to a node that conducts the inverter current and the load current. The controller further calculates a measured current based on the received current data, determines a voltage of the output capacitor, generates a derived current based on the determined voltage and a predetermined capacitance of the output capacitor, compares the measured current and the derived current to identify a fault location, and controls the static switch based on the identified fault location.

In yet another aspect, a method for identifying a fault location within a UPS system that includes a plurality of UPSs and a ring bus that electrically couples the UPSs together is provided. The method is at least partially performed by a controller of the UPS system. The method includes receiving current data representative of an inverter current and a load current associated with a first UPS of the UPSs. An output capacitor of the first UPS is coupled to a node that conducts the inverter current and the load current. The method further includes calculating a measured current based on the received current data, determining a voltage of the output capacitor, generating a derived current based on the determined voltage and a predetermined capacitance of the output capacitor, comparing the measured current and the derived current to identify a fault location, and controlling a static switch associated with the first UPS based on the identified fault location.

DETAILED DESCRIPTION

Exemplary embodiments of an uninterruptible power supply (UPS) system are described herein. A plurality of UPSs are arranged in a ring bus configuration and configured to supply power to at least one load. The UPSs are each coupled to the ring bus through a respective choke to isolate the UPSs from each other. At least one static switch module is coupled between an associated UPS and the ring bus to enable power from other UPSs to bypass the respective choke when a fault condition occurs at the UPS. A controller is communicatively coupled to the UPSs to monitor and otherwise control the UPSs.

Figure 1:
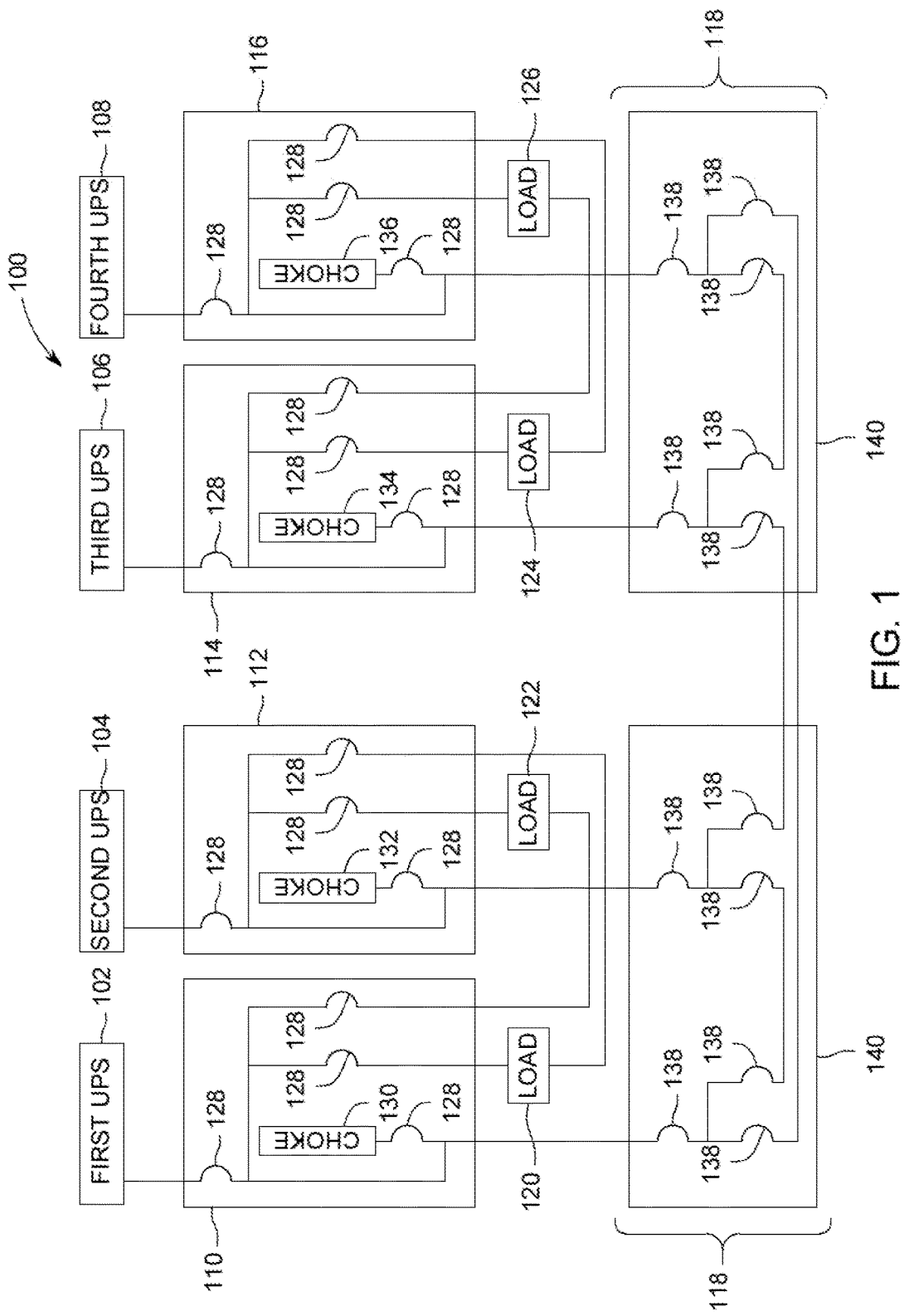
FIG. 1 is an exemplary schematic diagram of an isolated parallel ring bus system of uninterruptible power supplies (UPSs) for providing power redundancy to a load.

FIG. 1 is a schematic diagram of an exemplary UPS system 100 for providing redundant power to a load. In the exemplary embodiment, system 100 includes a first UPS 102, a second UPS 104, a third UPS 106, a fourth UPS 108, a first switchgear 110, a second switchgear 112, a third switchgear 114, a fourth switchgear 116, and a ring bus 118. In other embodiments, system 100 includes additional, fewer, or alternative components, including those described elsewhere herein.

In the exemplary embodiment, first UPS 102 is coupled to first switchgear 110. Similarly, second UPS 104 is coupled to second switchgear 112, third UPS 106 is coupled to third switchgear 114, and fourth UPS 108 is coupled to fourth switchgear 116. Each UPS 102, 104, 106, 108 is configured to generate a power output. In the exemplary embodiment, UPSs 102, 104, 106, 108 are rated to generate 1000 kilowatts (kW) of power. In some embodiments, UPSs 102, 104, 106, 108 are configured to store power and convert the stored power for transmission. In one embodiment, system 100 further includes fuses (not shown in FIG. 1) coupled to UPSs 102, 104, 106, 108 that are configured to electrically disconnect UPSs 102, 104, 106, 108 from system 100 when a fault condition occurs.

Switchgears 110, 112, 114, 116 are configured to receive the power outputs from the respective UPSs 102, 104, 106, 108 and transmit the outputs to ring bus 118 or loads 120, 122, 124, 126. In the exemplary embodiment, each load is coupled to a pair of switchgears through separate electrical connections (i.e., a "double corded configuration") to provide additional redundancy to each load. For example, load 120 is coupled between switchgears 110 and 112 to receive power from first UPS 102 and second UPS 104. Power received at load 120 from third and fourth UPSs 106, 108 is transmitted through ring bus 118 to switchgears 110, 112. In at least some embodiments, a power distribution unit (PDU) transformer is coupled between loads 120, 122, 124, 126 and system 100.

In the exemplary embodiment, switchgears 110, 112, 114, 116 include a plurality of electrical switches 128 that are configured to selectively open and close in response to a control signal (e.g., from a controller (not shown in FIG. 1)). Switches 128 may be, for example, circuit breakers. Switches 128 are positioned at various nodes within switchgears 110, 112, 114, 116 to facilitate locating and isolating faults within system 100. Switchgears 110, 112, 114, 116 further include chokes 130, 132, 134, 136, respectively. Chokes 130, 132, 134, 136 are coupled between UPSs 102, 104, 106, 108 and ring bus 118. Chokes 130, 132, 134, 136 facilitate load sharing within system 100 through frequency droop, and to limit fault current in case of a fault occurring at ring bus 118.

Ring bus 118 is configured to couple each UPS 102, 104, 106, 108 together such that the UPSs are configured to limit fault current and to provide additional power redundancy in the event of a fault condition at a UPS. Ring bus 118 includes a plurality of ring bus switches 138. In the exemplary embodiment, ring bus 118 is divided into data halls 140. Each data hall 140 is associated with a pair of UPSs and a pair of dual corded loads. For example, one data hall 140 is associated with UPSs 102, 104 and loads 120, 122. In the exemplary embodiment, ring bus 118 includes two data halls 140. In other embodiments, ring bus 118 includes a different number of data halls 140. In one embodiment, each data hall 140 is housed within a switchgear enclosure.

During a transient period after a faulted UPS is disconnected from system 100, power from ring bus 118 passes through an associated choke. The associated choke creates a voltage drop by blocking a portion of the power provided by ring bus 314, which causes the power quality at the PDU transformers and the loads coupled to the faulted UPS to be reduced. The associated voltage distortion may also cause saturation of the magnetic core of the PDU transformer, further reducing the power quality at the loads. Additionally, the choke may prevent sufficient current from passing to a fuse of the faulted UPS. With a limited fault current from ring bus 114, the fuse remains intact and the faulted UPS remains connected to system 100, which may cause a reduction in power quality at the load.

Figure 2:
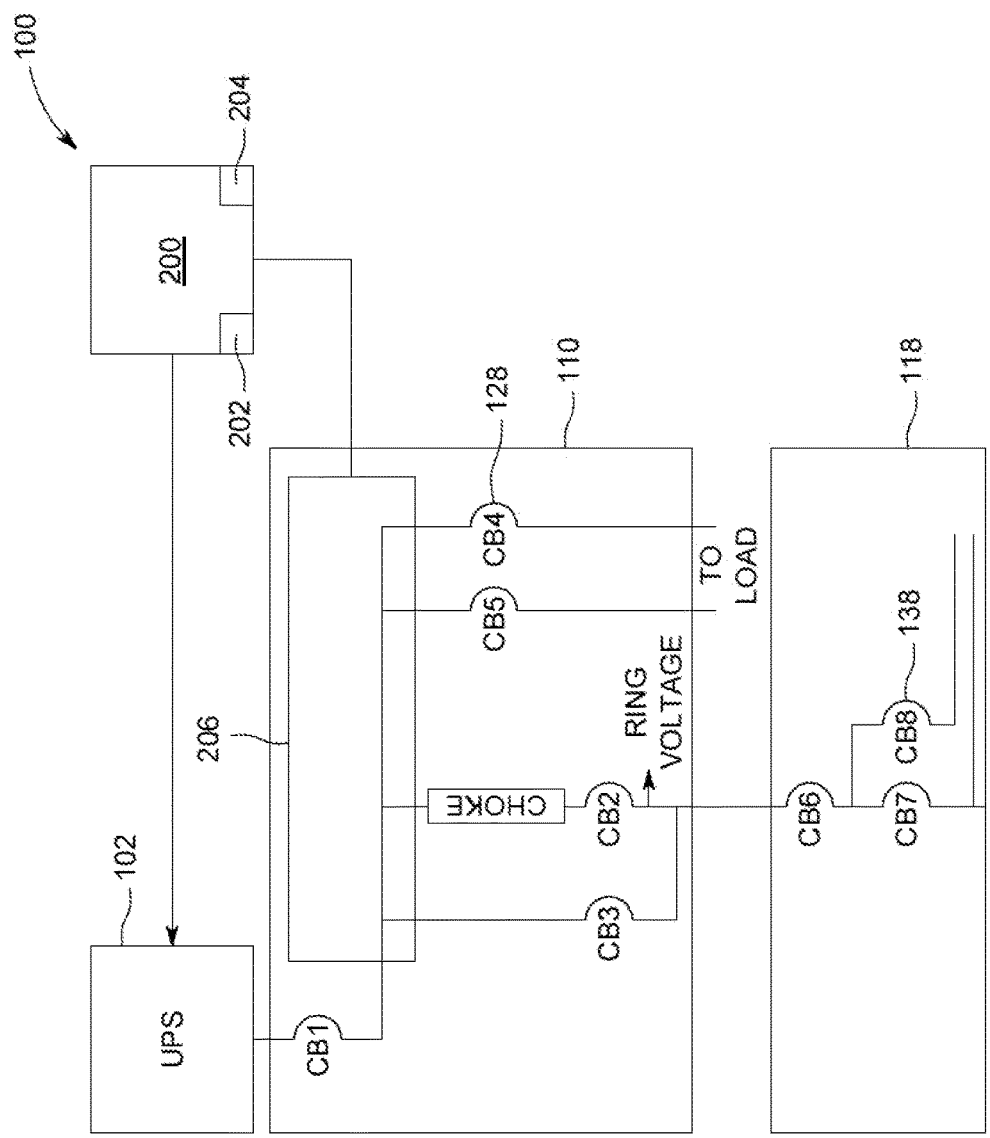
FIG. 2 is an exemplary schematic diagram of the system shown in FIG. 1 in communication with a controller.

FIG. 2 is a partial schematic view of system 100 (shown in FIG. 1). More specifically, FIG. 2 is a schematic view of first UPS 102, first switchgear 110, partial ring bus 118, and a controller 200.

In the exemplary embodiment, controller 200 is communicatively coupled to UPS 102. Controller 200 is also communicatively coupled to UPSs 104, 106, 108 within system 100 (each shown in FIG. 1). In other embodiments, a plurality of controllers may be used. In some embodiments, controller 200 is coupled to a substitute controller (not shown) that may be used in the event that controller 200 fails.

In the exemplary embodiment, controller 200 is implemented by a processor 202 communicatively coupled to a memory device 204 for executing instructions. In some embodiments, executable instructions are stored in memory device 204. Alternatively, controller 200 may be implemented using any circuitry that enables controller 200 to control operation of UPS 102 as described herein. For example, in some embodiments, controller 200 may include a state machine that learns or is pre-programmed to determine information relevant to which loads require power. For example, controller 200 dynamically determines what power resources will be needed and at what performance level and environmental conditions (e.g., temperature, humidity, time of day, etc.) those power resources will need to operate. Controller 200 may perform dynamic monitoring to determine whether a given load is satisfied with the power delivered, and whether delivered power is free of harmonics, transients, etc. In some embodiments, dynamic monitoring includes tracking resource usage to determine how much current or voltage should be delivered. Controller 200 may also monitor and/or control rapidity (i.e., bandwidth) and inverter capability (e.g., overload, reactive power, active power) to facilitate ensuring reliability of system 100 and minimizing performance degradation of UPSs 102.

Controller 200 may also include a state machine scheduler configured to selectively activate and deactivate power resources, set voltage and current levels, and/or take power saving actions (e.g., reducing current delivery). Controller 200 may also track characteristics (e.g., static allocation of power) of system 100 to determine whether one or more components of system 100 should be put on standby or whether power should be diverted.

In the exemplary embodiment, controller 200 performs one or more operations described herein by programming processor 202. For example, processor 202 may be programmed by encoding an operation as one or more executable instructions and by providing the executable instructions in memory device 204. Processor 202 may include one or more processing units (e.g., in a multi-core configuration). Further, processor 202 may be implemented using one or more heterogeneous processor systems in which a main processor is present with secondary processors on a single chip. As another illustrative example, processor 202 may be a symmetric multi-processor system containing multiple processors of the same type. Further, processor 202 may be implemented using any suitable programmable circuit including one or more systems and microcontrollers, microprocessors, reduced instruction set circuits (RISC), application specific integrated circuits (ASIC), programmable logic circuits, field programmable gate arrays (FPGA), and any other circuit capable of executing the functions described herein. In the exemplary embodiment, processor 202 causes controller 200 to operate UPS 102, as described herein.

Controller 200 is configured to transmit and receive data from UPS 102. For example, controller 200 is configured to transmit data to UPS 102 indicating ring bus 118 is connected. In another example, controller 200 receives data from UPS 102 indicating a fault condition has occurred or maintenance is required. Controller 200 is also configured to transmit control signals to system 100. For example, controller 200 is configured to adjust the magnitude, frequency, and/or phase of the power output generated by UPS 102. In one embodiment, controller 200 monitors each UPS and adjusts the operation of each connected UPS to synchronize the power outputs of the UPSs. Power losses caused by mismatched power outputs may be reduced by synchronizing the power outputs. In embodiments with multiple controllers, the controllers are in communication to coordinate the operation of each UPS. In another embodiment, UPS 102 may directly control magnitude and frequency of the generated output power based on its own measurements. In one embodiment, UPS 102 may employ frequency droop control based on output active power and voltage magnitude droop based on output reactive power. Series choke 120 facilitates load sharing between the UPS modules, and the employed droop techniques facilitate isochronous operation of all UPSs connected to ring bus 118.

Controller 200 is further configured to monitor the circuit within switchgear 110 to detect fault conditions and other abnormal conditions of system 100. In one embodiment, controller 200 is communicatively coupled to a contactor 206 within switchgear 110. In some embodiments, contactor 206 is replaced with a relay. When a current or voltage differential monitored by contactor 206 exceeds a predetermined threshold, controller 200 is configured to selectively open or close one or more switches 128, switches 138, and/or contactor 206 to electrically disconnect UPS 102 from system 100 and protect the loads.

Figure 3:
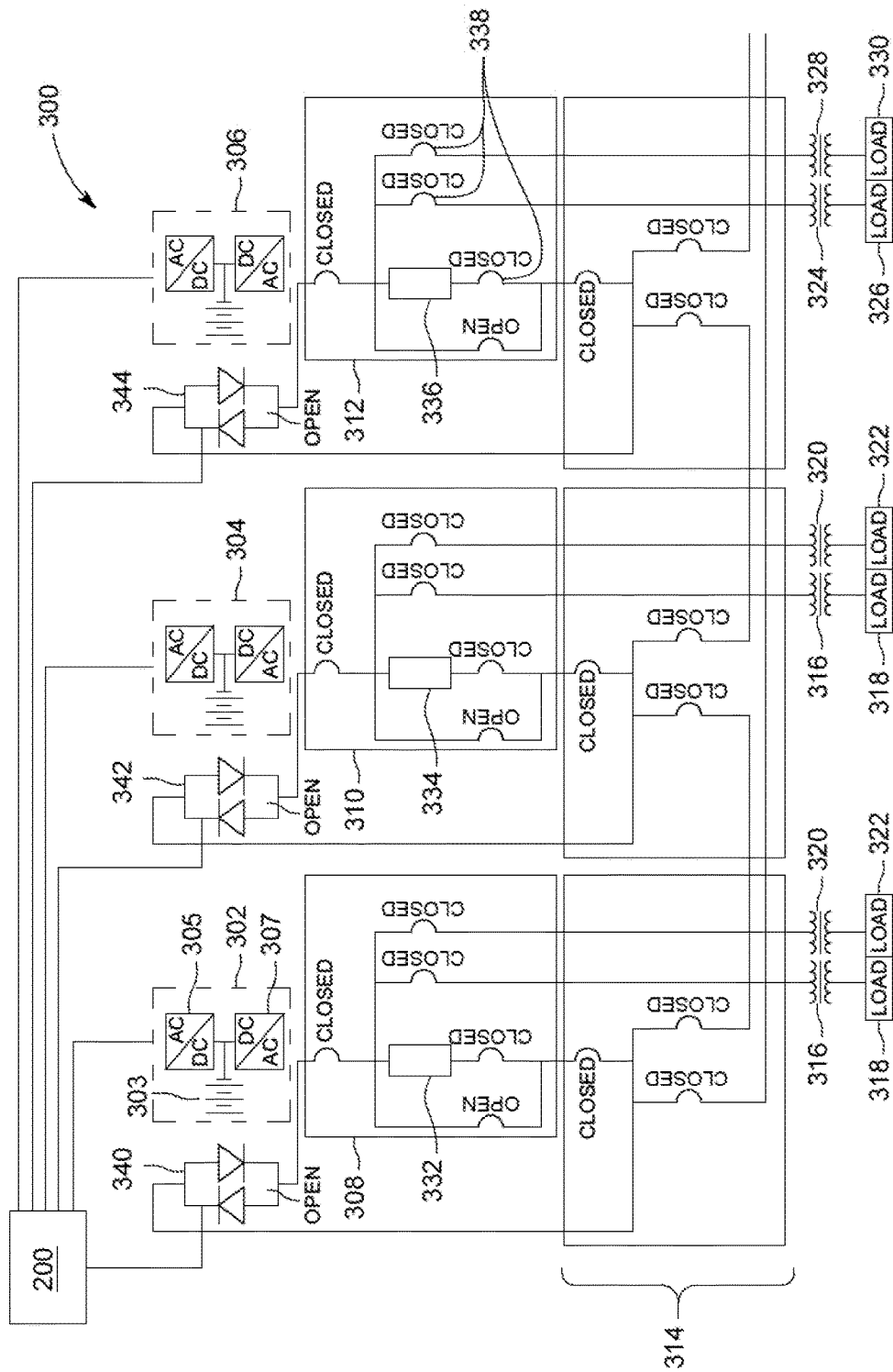
FIG. 3 is an exemplary schematic diagram of an isolated parallel ring bus system similar to the system shown in FIG. 1 with a static switch.

FIG. 3 is a schematic view of an exemplary UPS system 300. System 300 is substantially similar to system 100 (shown in FIG. 1) and, in the absence of contrary representation, includes similar components. In the exemplary embodiment, system 300 includes a first UPS 302, a second UPS 304, a third UPS 306, a first switchgear 308, a second switchgear 310, a third switchgear 312, and a ring bus 314. In other embodiments, system 300 includes additional, fewer, or alternative components, including those described elsewhere herein. For example, system 300 may include a fourth UPS (not shown in FIG. 3). System 300 further includes controller 200 (shown in FIG. 2) that is communicatively coupled to UPSs 302, 304, 306.

Each UPS 302, 304, 306 includes a power storage device 303, such as a battery or capacitor, an alternating current (AC) to direct current (DC) converter 305, and a DC-to-AC inverter 307. In other embodiments, UPSs 302 304, 306 have a different configuration. Power storage device 303 is configured to store electrical energy and provide the stored energy to the loads. In the exemplary embodiment, power storage device 303 is coupled between converter 305 and inverter 307. AC-to-DC converter 305 is coupled to an external power source (not shown), such as a utility grid, and is configured to convert AC power received from the external power source into DC power for power storage device 303. Inverter 307 is configured to receive DC power from power storage device 303 and AC-to-DC converter 305 and convert the power to an AC power output for system 300. In the exemplary embodiment, controller 200 is configured to control the operation of converter 305 and/or inverter 307 (e.g., adjusting switching frequencies, etc.) to adjust the operation of system 300 and the power supplied to the loads.

Each UPS 302, 304, 306 is coupled to a pair of PDU transformers and a pair of loads. In the exemplary embodiment, UPS 302 and UPS 304 are each coupled to a first PDU transformer 316, a first load 318, a second PDU transformer 320, and a second load 322. That is, loads 318, 322 are coupled to system 300 in a dual-corded configuration (i.e., two UPSs are separately connected to each load to provide redundant power). UPS 306 is coupled to a third PDU transformer 324, a third load 326, a fourth PDU transformer 328, and a fourth load 330. In the exemplary embodiment, loads 326, 330 are in a single-corded configuration (i.e., a single connection to system 300 to receive power). However, loads 326, 330 may further be coupled to another UPS (not shown).

Switchgears 308, 310, 312 include chokes 332, 334, 336, respectively. Switchgears 308, 310, 312 further include circuit breakers 338 that are configured to isolate faults within system 300 by selectively disconnecting a portion of system 300. In some embodiments, circuit breakers 338 are monitored and controlled by controller 200. For ring bus applications, chokes 332, 334, 336 are sized to sustain a bolted fault on ring bus 314 for a sufficient time to isolate the fault through the activation of the specific breakers 338 in system 300. Further, for situations where a breaker 338 fails to open, additional time may be built-in to determine and execute an alternative fault isolation strategy. Accordingly, to facilitate increasing a duration of time where inverter 307 of an associated UPS 302, 304, or 306 can sustain a bolted fault on ring bus 314, chokes 332, 334, 336 may be sized to operate inverter 307 in a linear mode under a short circuit on ring bus 314.

To prevent limited fault current and reduced power quality at the loads during the transient period after a fault is detected at a UPS, system 300 includes static switch modules 340, 342, 344. Static switch modules 340, 342, 344 are coupled between ring bus 318 and UPSs 302, 304, 306, respectively. Static switch modules 340, 342, 344 may include, but are not limited to, thyristors and insulated gate bi-polar transistors (IGBTs). In other embodiments, static switch modules 340, 342, 344 are replaced with contactors, static transfer switches, and/or other relatively fast switching devices. In the exemplary embodiment, each static switch module 340, 342, 344 includes a pair of static switches. In other embodiments, a different number of static switch modules and/or static switches per module may be included. Although it is shown that static switch modules 340, 342, 344 are outside of switchgears 308, 310, 312, it is to be understood that static switch modules 340, 342, 344 may be within switchgears 308, 310, 312 or UPSs 302, 304, 306.

Static switch modules 340, 342, 344 are configured to selectively bypass chokes 332, 334, 336. In particular, static switch modules 340, 342, 344 are configured to selectively bypass chokes 332, 334, 336 in response to a detected fault condition at an associated UPS. During normal operation of system 300 (i.e., no fault conditions have occurred), static switch modules 340, 342, 344 are open. Static switch modules 340, 342, 344 are closed in response to a fault condition detected at an associated UPS. Static switch modules 340, 342, 344 are configured to provide a low impedance path between the faulted UPS and ring bus 318, thereby facilitating sufficient fault current to disconnect the faulted UPS and maintaining or improving power quality at the loads using the power provided through ring bus 318. In the exemplary embodiment, the fault current (i.e., current delivered in response to a fault condition) provided by ring bus 318 through static switch modules 340, 342, 344 is configured to be sufficient to blow a fuse associated with the faulted UPS to disconnect the faulted UPS from system 300. Using static switches enables relatively fast reaction times to a detected fault in comparison to circuit breakers 338 and other switching devices. In one example, an exemplary circuit breaker closes in approximately 50 milliseconds (ms) while an exemplary static switch closes in approximately 6-7 ms.

In the exemplary embodiment, controller 200 is communicatively coupled to static switch modules 340, 342, 344 to selectively open and close switches 340, 342, 344. Controller 200 is configured to detect a fault condition, determine which (if any) UPS is associated with the fault condition, and close a corresponding static switch to facilitate fault current bypassing a choke. An exemplary detection and control method is described in detail further below.

In some embodiments, static switch modules 340, 342, and 344 may be used in a different power system that includes parallel inverters coupled together with a choke. That is, the systems and methods described herein are not limited to UPS systems or UPS systems with a ring bus. The UPS systems are for illustrative purposes only and are not intended to limit the systems and methods as described herein. In one example, a static switch module may be coupled to an inverter parallel to a choke such that the static switch module is configured to selectively bypass the choke.

Figure 4:
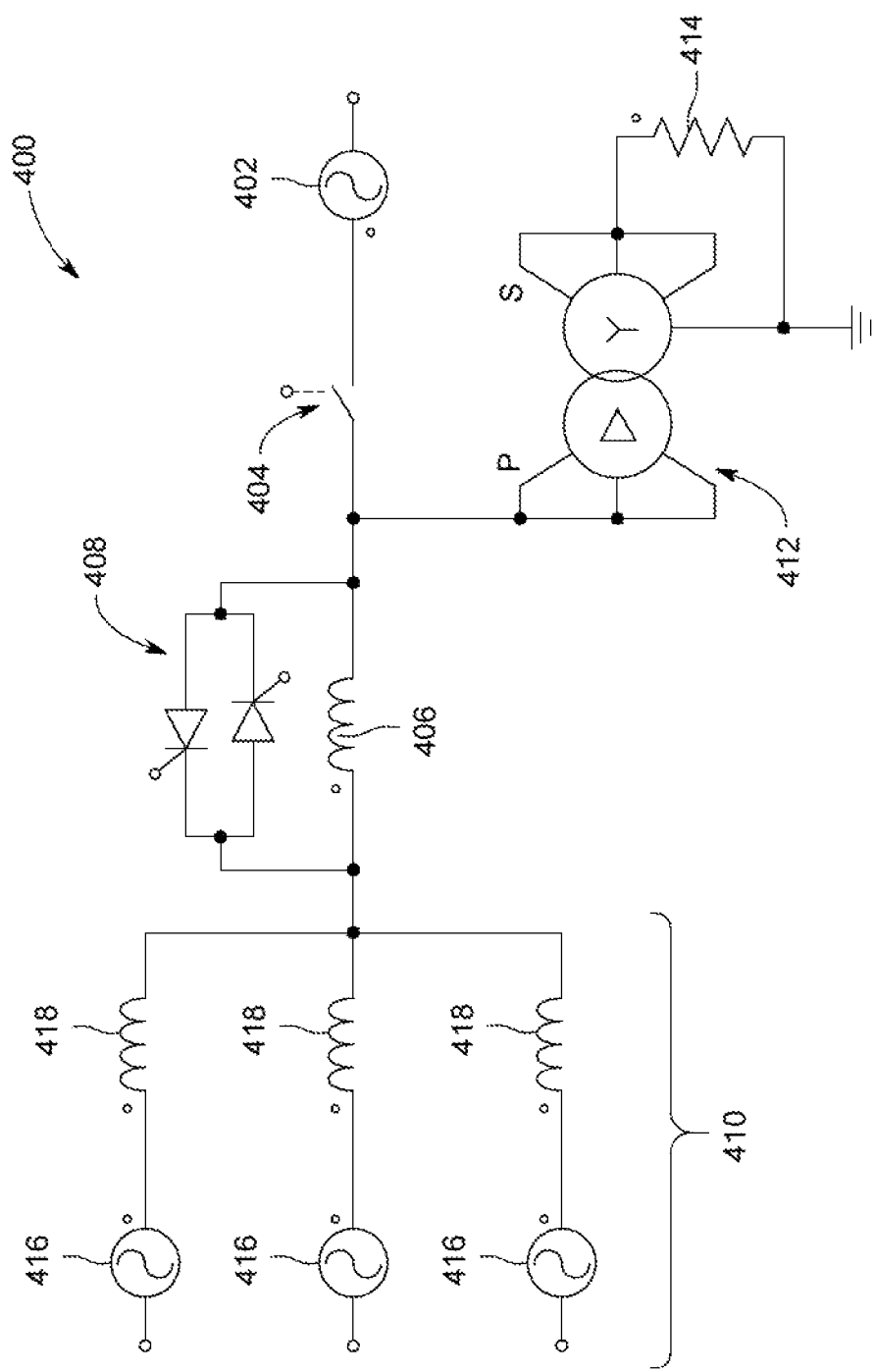
FIG. 4 is an exemplary schematic diagram of the system shown in FIG. 3 during a UPS fault condition.
Figure 5:
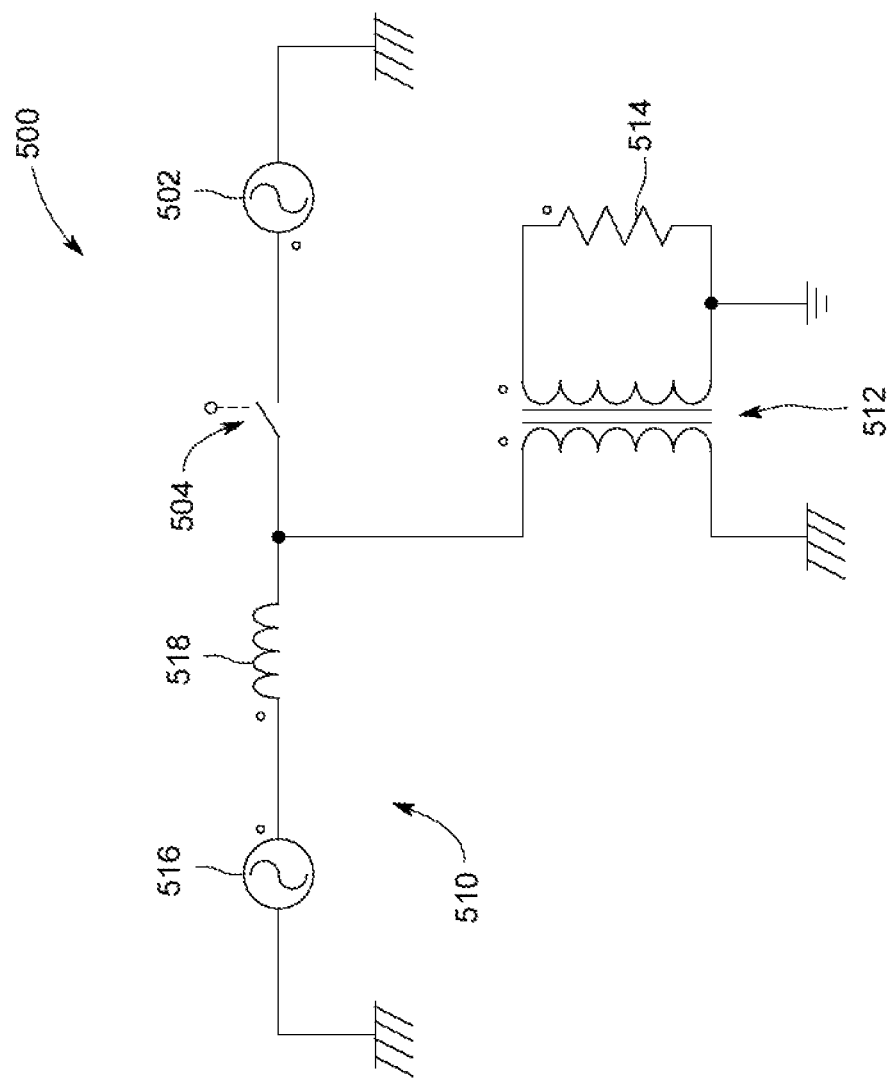
FIG. 5 is an exemplary schematic diagram of the system during the UPS fault condition shown in FIG. 4 for a single power phase.

FIGS. 4 and 5 are exemplary schematic diagrams 400, 500 of an exemplary UPS system, such system 300 (shown in FIG. 3), during a fault condition at a UPS. In particular, diagram 400 is a one-wire diagram of the three-phase system, and diagram 500 is a simplified circuit showing only one of the phases, with ring 410 modeled as a single power source. In the exemplary embodiment, diagram 400 includes a faulted UPS 402, a fuse 404, a choke 406, a static switch module 408, a ring bus 410, a PDU transformer 412, and a load 414. Ring bus 410 includes three UPSs 416 with respective chokes 418. In the exemplary embodiment, UPSs 416 are assumed to be operating without any fault conditions. Diagram 500 includes a faulted UPS 502, a fuse 504, a ring bus 510, a PDU transformer 512, and a load 514. Similar to ring bus 410, ring bus 510 includes multiple UPSs, represented as a single power source 516 and a choke 518. In other embodiments, the UPS systems in diagrams 400, 500 may include fewer, additional, or alternative components, including those described elsewhere herein.

With respect to FIGS. 4 and 5, the UPSs are represented as AC power sources. A fault condition has occurred at faulted UPSs 402, 502. That is, UPSs 402, 502 generate substantially no power or power different from the power generated during normal operation of UPSs 402, 502. For example, the power factor of the power may be reduced. In the exemplary embodiment, fuses 404, 504 are configured to electrically disconnect UPSs 402, 502 from ring bus 410, 510 and loads 414, 514 when fuses 404, 504 receive a current that exceeds a predetermined current threshold. When the fault condition results in substantially no power generated by UPSs 402, 502, ring buses 410, 510 are configured to provide a fault current that exceeds the current threshold to fuses 404, 504. Fuses 404, 504 are melted by the fault current to electrically disconnect faulted UPSs 402, 502.

With respect to FIG. 4, the fault current bypasses choke 406 through static switch module 408. Static switch module 408 is configured to provide substantially no voltage or current drop. Accordingly, since the fault current bypasses the choke through the static switch, neither the choke nor the static switch are shown in FIG. 5.

PDU transformers 412, 512 are configured to distribute power to loads 414, 514. In the exemplary embodiment, PDU transformer 412 is a delta-wye transformer. Although a single load is shown in FIGS. 4 and 5, it is to be understood that multiple loads may be coupled to PDU transformers 412, 512. Power is provided to PDU transformer 412 from ring bus 410 through static switch module 408. Similarly, power is provided to PDU transformer 512 from ring bus 510. In addition to providing power to PDU transformer 412 without the voltage drop caused by choke 406, static switch module 408 provides a low impedance path for the fault current towards faulted UPS 402. With respect to diagram 500, the fault current would be provided by power source 516. Upon failure of UPS 502, the voltage at its output terminal collapses. The resulting potential difference across choke 518 drives a relatively steep rise of the current over it to feed the fault at UPS 502. Once the fault is electrically disconnected by melting fuse 504 using the fault current, the magnetic flux applied to choke 518 to generate the fault current is then balanced by a reverse-applied flux that drives the current down. As PDU transformer 512 is exposed to the resulting voltage, the balanced flux balance applied to choke 518 also yields a balanced flux on PDU transformer 512. Therefore, with respect to diagram 400, static switch module 408 is configured to facilitate maintaining flux balance on PDU transformer 412 in the event of an internal fault on UPS 402.

Unlike static switch module 408, static transfer switches (STS) that may be used in UPS systems are likely to cause transformer saturation when transferring between asynchronous or out-of-phase power sources. In particular, in an example embodiment in which an STS feeds a PDU transformer that includes a primary source connected to the output of a UPS and a secondary source fed by a utility or ring bus. The two sources are likely to exhibit phase shift, and an out-of-phase transfer between the two power sources to the PDU transformer would drive the transformer into saturation, compromising power quality to one or more critical loads. The transfer may be delayed to avoid saturation, but the resulting power quality may not meet the demand of the load.

FIGS. 6-9 are simplified diagrams illustrating fault scenarios for an exemplary fault detection method to distinguish between UPS faults and a load fault that may be used by system 300 (shown in FIG. 3). As described above, closing a static switch module associated with a faulted UPS causes the fault current from the ring bus to bypass a choke and blow a fuse of the faulted UPS. However, in the event of a fault at the load, closing the static switch module causes the ring bus to be connected to the fault. Accordingly, system 300 is configured to determine a location of a fault and react accordingly. Although FIGS. 6-9 only illustrate four exemplary fault scenarios, the exemplary fault detection method may also be used to detect faults in other additional fault scenarios and determine a location of the faults.

With respect to FIGS. 3 and 6-9, controller 200 is configured to monitor electrical data at each UPS 302, 304, 306 to detect and locate a fault. In the exemplary method shown in FIGS. 6-9, electrical data associated with inverter 307 is monitored. Inverter 307 includes two parallel converter modules 602 that generate an AC power output, an output inductance 604, and an output capacitor 606. The AC power output is transmitted to an associated switchgear 308, 310, or 312 to be delivered to the load and ring bus. In other embodiments, inverter 307 includes a different number of converter modules 602 (including one). Multiple modules are driven by the same Pulse Width Modulation (PWM) signal generated by controller 200 based on voltage and current readings from only one of the converter modules 602.

Controller 200 is configured to collect measured current data associated with one output capacitor 606 and calculate a derived current associated with the same output capacitor 606. Based on the comparison of the measured current data and the derived current, controller 200 is configured to determine a fault location (if any) and perform appropriate response actions to isolate the fault. Controller 200 opens and closes static switch modules, circuit breakers, switches, and the like within system 300 to isolate the fault. For example, if a UPS has a fault condition, controller 200 is configured to close a respective static switch to facilitate transmitting sufficient fault current from the ring bus to the fuse to disconnect the fuse. In another example, if the load has a fault condition, controller 200 is configured to open a circuit breaker between the faulted load and the UPSs of system 300 to disconnect the faulted line from the system.

Controller 200 is configured to monitor an inverter bridge current $I_S$, a load current $I_{Load}$, and an output capacitor voltage $V_C$ using one or more sensors (not shown). The sensors may be any type of sensor that is configured to collect, calculate, or otherwise derive current and/or voltage data. The data is collected periodically, continuously, and/or in response to a signal (e.g., a sensor alert, a user command, etc.). Controller 200 is configured to calculate a measured current $I_C$ as the difference between the inverter bridge current $I_S$ and the load current $I_{Load}$. Controller 200 is further configured to calculate a derived current $I_D$ using the output capacitor voltage $V_C$ and a predetermined capacitance C of the measured output capacitor 606 ($I_D = C*dV_C/dt$). In one embodiment, the predetermined capacitance C is a nominal or rated value of output capacitor 606. Controller 200 compares the measured current $I_C$ and the derived current $I_D$. If the difference between current values exceeds a predetermined threshold, then a failure within the UPS is causing at least a portion of the current from reaching the load. Using data collected from inverter 307 enables controller 200 to distinguish between faults at the UPS and faults at the load because a fault at the load does not cause the difference in the current values to exceed the threshold. As such, controller 200 is configured to control system 300 to isolate the fault based on the location of the fault.

Figure 6:
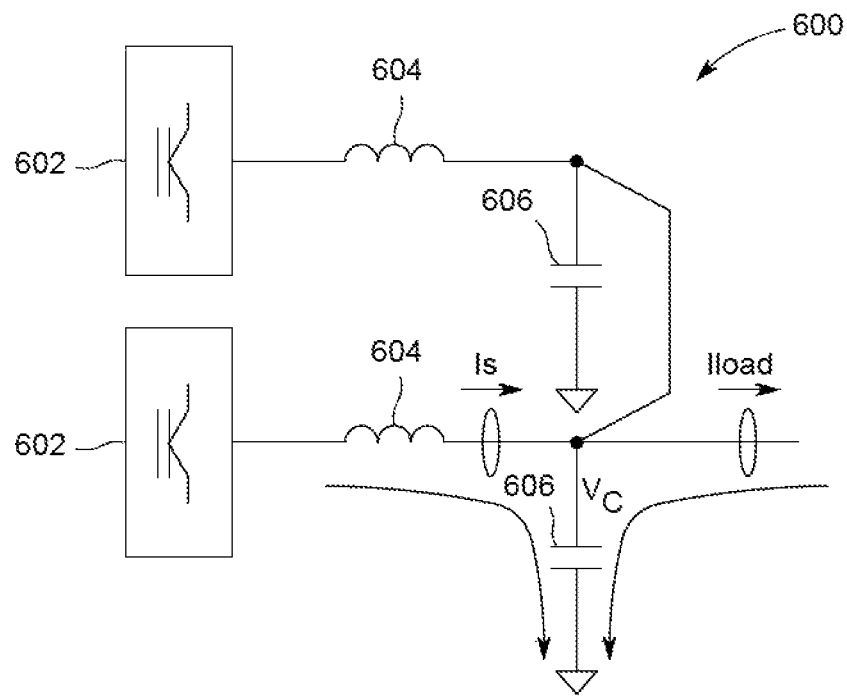
FIG. 6 is a simplified diagram of a first exemplary scenario for fault detection that may be used by the system shown in FIG. 3.
Figure 7:
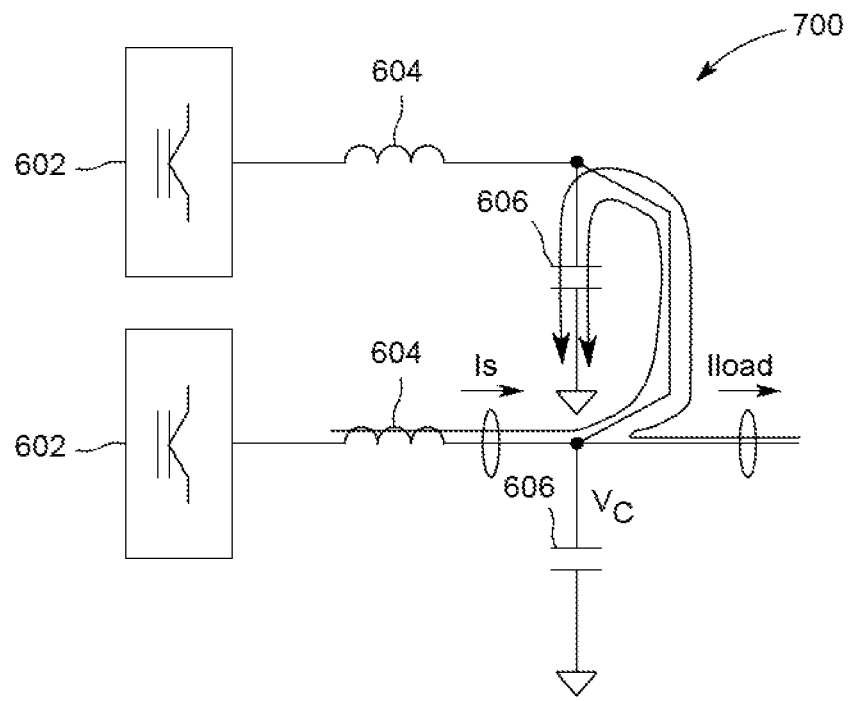
FIG. 7 is a simplified diagram of a second exemplary scenario for fault detection that may be used by the system shown in FIG. 3.

For example, FIG. 6 is an exemplary diagram 600 of a first scenario in which the measured output capacitor 606 has shorted. The inverter bridge current $I_S$, and the load current $I_{Load}$ are drawn to ground or neutral through the faulted output capacitor 606. The measured current $I_C$ is relatively greater than the derived current $I_D$ such that the difference exceeds the predetermined threshold. Accordingly, controller 200 identifies the fault and determines that the fault is located at the UPS. In response, controller 200 closes the static switch to isolate the fault from system 300. Similar to FIG. 6, FIG. 7 is an exemplary diagram 700 of a second scenario in which an unmeasured output capacitor 606 has shorted. In the illustrated embodiment, the unmeasured output capacitor 606 is the upper output capacitor 606. The measured current $I_C$ is relatively greater than the derived current $I_D$ similar to the first scenario and therefore controller 200 detects the fault.

Figure 8:
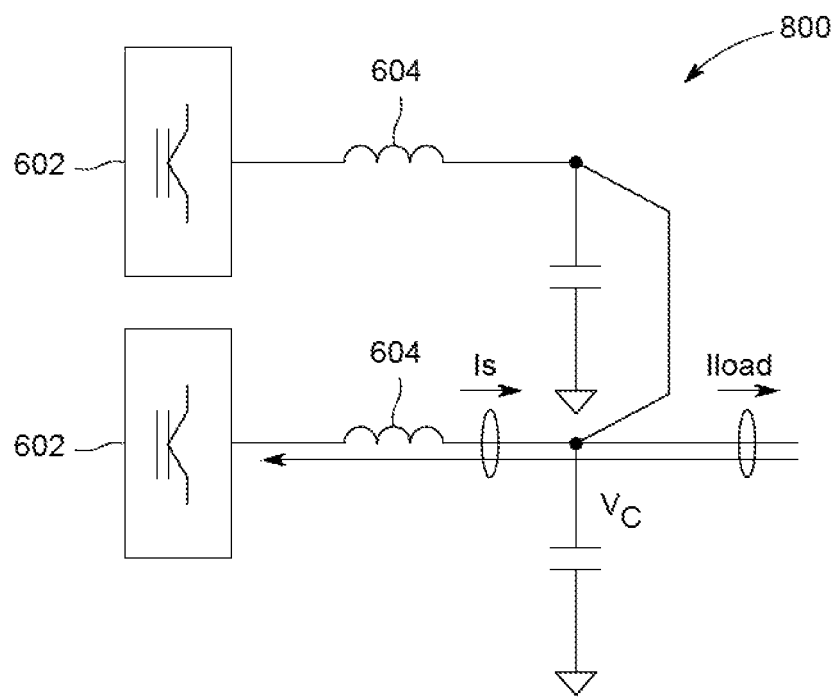
FIG. 8 is a simplified diagram of a third exemplary scenario for fault detection that may be used by the system shown in FIG. 3.
Figure 9:
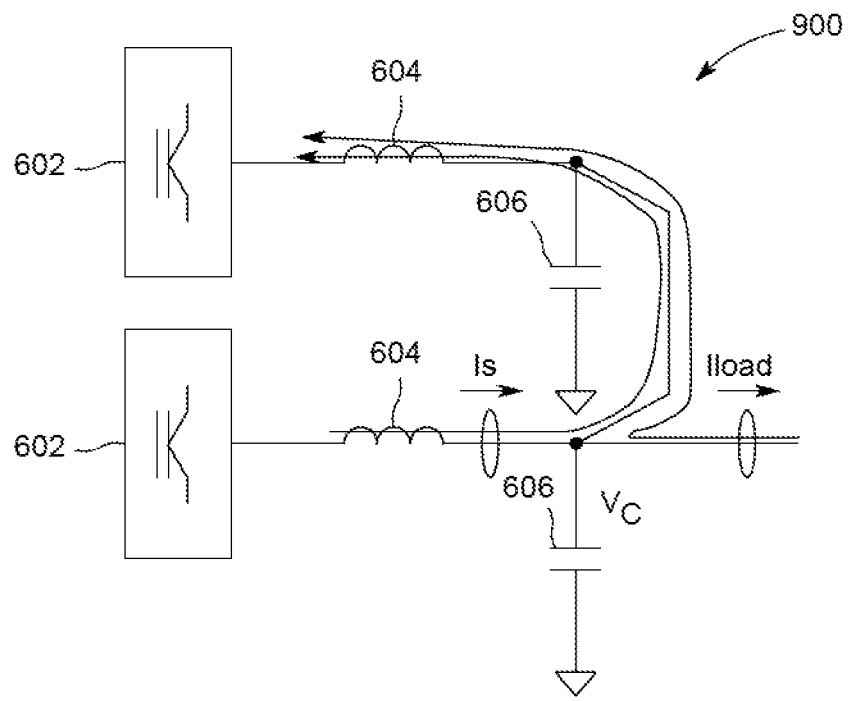
FIG. 9 is a simplified diagram of a fourth exemplary scenario for fault detection that may be used by the system shown in FIG. 3.

FIG. 8 is an exemplary diagram 800 of a third scenario in which a measured converter 602 has a failure while FIG. 9 is an exemplary diagram 900 of a fourth scenario in which an unmeasured converter 602 has a failure. In the third and fourth scenarios, a link capacitor (not shown) within the failed converter 602 collapses to substantially zero impedance. In the fourth scenario, similar to the first and second scenarios, the difference between the measured current $I_C$ and the derived current $I_D$ exceeds the predetermined threshold and controller 200 determines a fault at the UPS has occurred. However, in the third scenario, the measured current $I_C$ and the derived current $I_D$ are consistent with each other, and the location of the fault remains undetermined. In the exemplary embodiment, controller 200 is communicatively coupled to inverter 307, and inverter 307 is configured to alert controller 200 when a link capacitor has collapsed. For example, in an exemplary embodiment, inverter 307 may be implemented as a Voltage Source Converter (VSC) with an associated DC-side capacitance. A fault on the DC-side capacitance (i.e., causing the impedance of the DC-side to collapse to substantially zero) causes a DC voltage associated with the DC-side capacitance to collapse, thereby enabling prompt fault detection by detecting the drop in the DC voltage. A converter fault driving a short-circuit on the DC-side yields the same effects and triggers the same detection.

Figure 10:
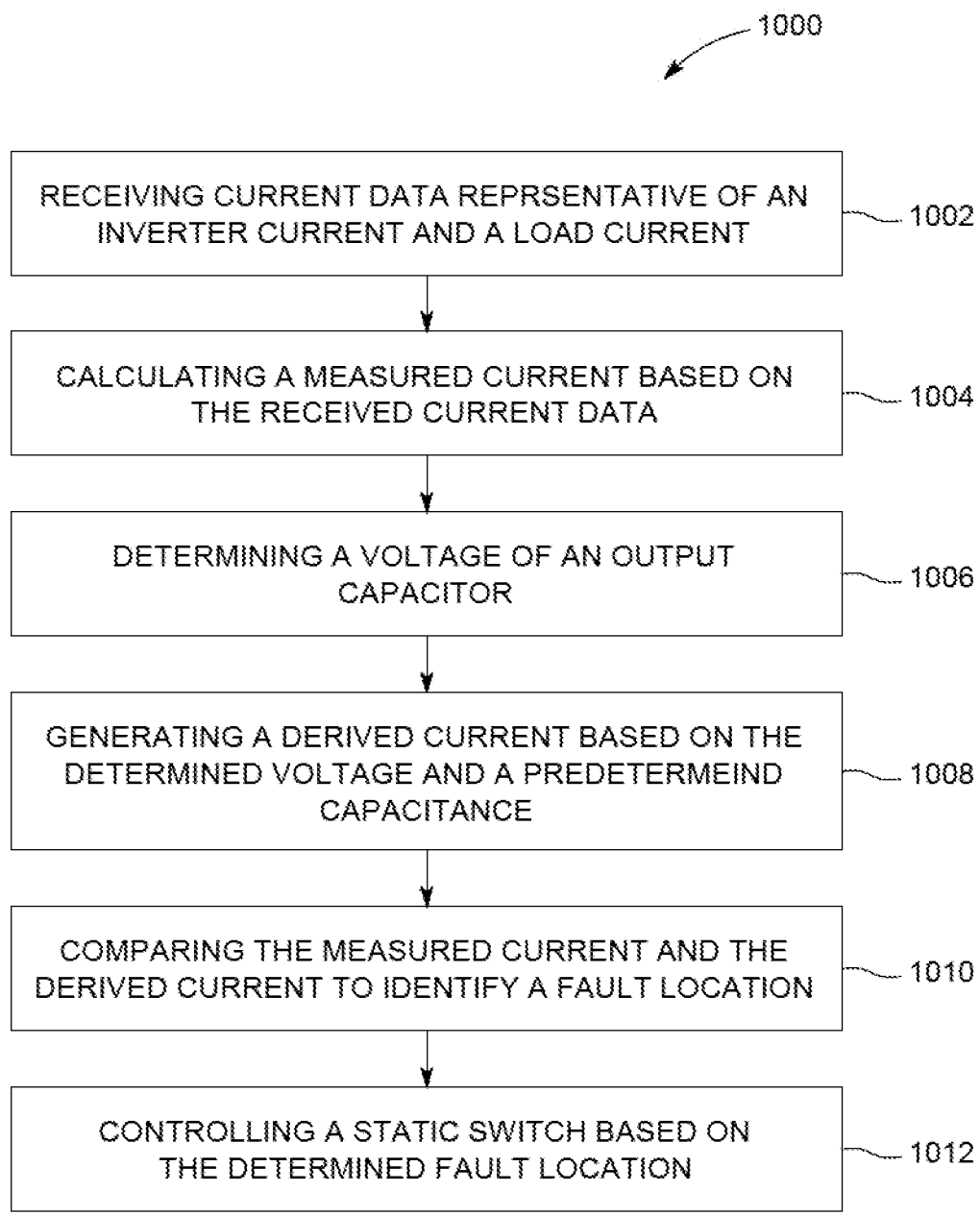
FIG. 10 is a flow diagram of an exemplary method for identifying a fault location that may be used with the system shown in FIG. 3.

FIG. 10 is a flow diagram of an exemplary method 1000 for use with a UPS system, such as system 300 (shown in FIG. 3). In the exemplary embodiment, method 1000 is at least partially performed by a controller (e.g., controller 200, shown in FIG. 3). In other embodiments, method 1000 includes additional, fewer, or alternative steps, including those described elsewhere herein.

In some embodiments, method 1000 is performed continuously. In other embodiments, method 1000 is performed periodically and/or in response to a control signal, such as a user command or a sensor alert signal. The controller receives 1002 current data representative of an inverter current (e.g., inverter bridge current $I_S$, shown in FIGS. 6-9) and a load current (e.g., load current $I_{Load}$, shown in FIGS. 6-9) for one or more UPSs in a ring bus configuration. An output capacitor is coupled to a node between the inverter current and the load current. The controller further calculates 1004 a measured current based on the received current data. The controller determines 1006 a voltage of the output capacitor and generates 1008 a derived current based on the determined voltage and a predetermined capacitance (e.g., a nominal capacitance) of the output capacitor.

The controller further compares 1010 the measured current and the derived current to identify a fault location and distinguish between a UPS fault condition and a load fault condition. Although referred to as a "load fault condition", it is to be understood that a load fault condition refers to a fault at any location external to the UPSs. In one embodiment, the controller calculates a difference between the measured and derived currents and compares the difference to a predetermined threshold. If the difference exceeds the threshold, the controller determines a UPS fault condition has occurred. If the difference is within the threshold, the controller may determine a load fault condition has occurred. In some embodiments, the controller may receive an alert signal from a UPS indicating a UPS fault condition has occurred irrespective of the comparison of the current difference and the threshold. The controller controls 1012 a static switch based on the identified fault location. For example, if the fault location is at the UPS associated with the static switch, the controller controls 1012 the static switch to close, thereby facilitating fault current from the ring bus to bypass a choke associated with the faulted UPS. In some embodiments, when a load fault condition is identified, the controller controls 1012 the static switch to remain open. In addition, the controller controls one or more circuit breakers or switches of the UPS system to isolate the location of the fault condition from the UPSs. For example, if a load has a fault condition, the controller causes one or more circuit breakers between the UPSs and the load to disconnect.

The foregoing systems and methods are configured to facilitate improved response times and improved power quality at a load in response to a UPS fault condition within a ring bus UPS configuration. The foregoing systems and methods are further configured to facilitate improved accuracy and location of faults within a ring bus UPS configuration.

Exemplary embodiments of systems and methods for uninterruptible power supplies are described above in detail. The systems and methods are not limited to the specific embodiments described herein but, rather, components of the systems and/or operations of the methods may be utilized independently and separately from other components and/or operations described herein. Further, the described components and/or operations may also be defined in, or used in combination with, other systems, methods, and/or devices, and are not limited to practice with only the systems described herein.

The order of execution or performance of the operations in the embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An uninterruptible power supply (UPS) system comprising:
   a plurality of UPSs;
   a ring bus that electrically couples said plurality of UPSs together;
   a static switch coupled between an associated UPS of said plurality of UPSs and said ring bus; and
   a controller operable to:
     receive current data representative of an inverter current and a load current associated with said associated UPS, wherein an output capacitor of said associated UPS is coupled to a node that conducts the inverter current and the load current;
     calculate a measured current based on the received current data, wherein the measured current is the difference between the inverter current and the load current;
     determine a voltage of said output capacitor;
     generate a derived current based on the determined voltage and a predetermined capacitance of said output capacitor;
     compare the measured current and the derived current to identify a fault location; and
     control said static switch based on the identified fault location.

2. The UPS system in accordance with claim 1, wherein said controller is further operable to:
   calculate a difference between the measured current and the derived current;
   compare the difference between the measured current and the derived current to a predetermined threshold; and
   determine the fault location is at said associated UPS when the difference between the measured current and the derived current exceeds the predetermined threshold.

3. The UPS system in accordance with claim 1 further comprising a circuit breaker, wherein said controller is further operable to:
   calculate a difference between the measured current and the derived current;
   compare the difference between the measured current and the derived current to a predetermined threshold;
   determine the fault location is at a location external to said associated UPS when the difference between the measured current and the derived current is within the predetermined threshold; and
   control said circuit breaker to isolate the determined fault location.

4. The UPS system in accordance with claim 1, wherein said associated UPS comprises a plurality of converters, the inverter is current generated by a first converter of said plurality of converters and the load current is an output current of said plurality of converters.

5. The UPS system in accordance with claim 4, wherein said controller is further operable to:
   receive, from said associated UPS, an alert signal indicating said first converter has failed to cause a UPS fault condition at said associated UPS; and
   control said static switch to close in response to the alert signal.

6. The UPS system in accordance with claim 1, wherein said controller is further operable to control the static switch to close when the determined fault location is at the associated UPS.

7. A controller for identifying a fault location in an uninterruptible power supply (UPS) system including a plurality of UPSs and a ring bus that electrically couples the plurality of UPSs together, said controller communicatively coupled to a static switch coupled between an associated UPS of the plurality of UPSs and the ring bus, said controller operable to:
- receive current data representative of an inverter current and a load current associated with the associated UPS, wherein an output capacitor of the associated UPS is coupled to a node that conducts the inverter current and the load current;
- calculate a measured current based on the received current data, wherein the measured is a difference between the inverter current and the load current;
- determine a voltage of the output capacitor;
- generate a derived current based on the determined voltage and a predetermined capacitance of the output capacitor;
- compare the measured current and the derived current to identify a fault location; and
- control the static switch based on the identified fault location.

8. The controller in accordance with claim 7, wherein said controller is further operable to:
- calculate a difference between the measured current and the derived current;
- compare the difference between the measured current and the derived current to a predetermined threshold; and
- determine the fault location is at the associated UPS when the difference between the measured current and the derived current exceeds the predetermined threshold.

9. The controller in accordance with claim 7, wherein said controller is further operable to:
- calculate a difference between the measured current and the derived current;
- compare the difference between the measured current and the derived current to a predetermined threshold;
- determine the fault location is at a location external to the associated UPS when the difference between the measured current and the derived current is within the predetermined threshold; and
- control a circuit breaker of the UPS system to isolate the determined fault location.

10. The controller in accordance with claim 7, wherein the inverter current is generated by a first converter of a plurality of converters and the load current is an output current of the plurality of converters, wherein said controller is further operable to:
- receive, from the associated UPS, an alert signal indicating the first converter has failed to cause a UPS fault condition at the associated UPS; and
- control the static switch to close in response to the alert signal.

11. The controller in accordance with claim 7, wherein said controller is further operable to control the static switch to close when the determined fault location is at the associated UPS.

12. A method for identifying a fault location within an uninterruptible power supply (UPS) system including a plurality of UPSs and a ring bus that electrically couples the plurality of UPSs together, said method comprising:
- receiving, by a controller, current data representative of an inverter current and a load current associated with a first UPS of the plurality of UPS s, wherein an output capacitor of the first UPS is coupled to a node that conducts the inverter current and the load current;
- calculating a measured current based on the received current data, wherein the measured current is a difference between the inverter current and the load current;
- determining a voltage of the output capacitor;
- generating, by the controller, a derived current based on the determined voltage and a predetermined capacitance of the output capacitor;
- comparing the measured current and the derived current to identify a fault location;
- and controlling, by the controller, a static switch associated with the first UPS based on the identified fault location.

13. The method in accordance with claim 12, wherein comparing the measured current and the derived current further comprises:
- calculating a difference between the measured current and the derived current;
- comparing the difference between the measured current and the derived current to a predetermined threshold; and
- determining the fault location is at the first UPS when the difference between the measured current and the derived current exceeds the predetermined threshold.

14. The method in accordance with claim 12 further comprising:
- calculating a difference between the measured current and the derived current;
- comparing the difference between the measured current and the derived current to a predetermined threshold;
- determining the fault location is at a location external to the first UPS when the difference between the measured current and the derived current is within the predetermined threshold; and
- controlling a circuit breaker of the UPS system to isolate the determined fault location.

15. The method in accordance with claim 12, wherein the inverter current is generated by a first converter of a plurality of converters associated with the first UPS and the load current is an output current of the plurality of converters.

16. The method in accordance with claim 15, wherein controlling the static switch further comprises:
- receiving, from the first UPS, an alert signal indicating the first converter has failed to cause a UPS fault condition at the first UPS; and
- controlling, by the controller, the static switch to close in response to the alert signal.

17. The method in accordance with claim 12, wherein controlling the static switch further comprises controlling the static switch to close when the determined fault location is at the first UPS.

* * * * *